US008120247B2

(12) United States Patent
Schmidt et al.

(10) Patent No.: US 8,120,247 B2
(45) Date of Patent: Feb. 21, 2012

(54) LIGHT EMITTING DEVICE WITH A PLURALITY OF UNIFORM DIAMETER CERAMIC SPHERICAL COLOR CONVERTER ELEMENTS

(75) Inventors: Peter Schmidt, Aachen (DE); Hans-Helmut Bechtel, Roetgen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 57 days.

(21) Appl. No.: 12/305,380

(22) PCT Filed: Jun. 11, 2007

(86) PCT No.: PCT/IB2007/052193
§ 371 (c)(1),
(2), (4) Date: Dec. 18, 2008

(87) PCT Pub. No.: WO2007/148253
PCT Pub. Date: Dec. 27, 2007

(65) Prior Publication Data
US 2009/0174309 A1   Jul. 9, 2009

(30) Foreign Application Priority Data
Jun. 21, 2006   (EP) .................................... 06115815

(51) Int. Cl.
*H01J 1/62*  (2006.01)
(52) U.S. Cl. ......................................... 313/506; 313/483
(58) Field of Classification Search .......... 313/504–506, 313/503, 501, 486–487
See application file for complete search history.

(56) References Cited

U.S. PATENT DOCUMENTS

| | | |
|---|---|---|
| 6,791,259 B1 | 9/2004 | Stokes et al. |
| 2004/0145308 A1 | 7/2004 | Rossner et al. |
| 2004/0149958 A1 | 8/2004 | Chua |
| 2004/0169474 A1 | 9/2004 | Hampden-Smith et al. |
| 2004/0183085 A1 | 9/2004 | Okazaki |
| 2005/0062403 A1 | 3/2005 | Odaki |
| 2005/0122034 A1 | 6/2005 | Yamashita |
| 2005/0211991 A1 | 9/2005 | Mori et al. |
| 2005/0224828 A1 | 10/2005 | Oon et al. |
| 2006/0022582 A1 | 2/2006 | Radkov |
| 2006/0091787 A1 * | 5/2006 | Kabay et al. .................. 313/501 |

FOREIGN PATENT DOCUMENTS
EP   0918045 A1   5/1999
* cited by examiner

*Primary Examiner* — Joseph L Williams

(57) ABSTRACT

The invention relates to a light emitting device comprising at least one light source and at least one ceramic spherical color converter material, which helps to ease the manufacture as well as to improve the luminescence properties of the light emitting device.

11 Claims, 5 Drawing Sheets

LIGHT EMITTING DEVICE WITH A PLURALITY OF UNIFORM DIAMETER CERAMIC SPHERICAL COLOR CONVERTER ELEMENTS

The present invention is directed to light emitting devices, especially to the field of LEDs Phosphors comprising silicates, phosphates (for example, apatite) and aluminates as host materials, with transition metals or rare earth metals added as activating materials to the host materials, are widely known. As blue LEDs, in particular, have become practical in recent years, the development of white light emitting devices utilizing such blue LEDs in combination with such phosphor materials is being energetically pursued. As white light emitting devices with LEDs as s light source are expected to have lower power consumption and longer usable life than existing white light sources, development is progressing towards their application in backlights of liquid crystal panels, indoor and outdoor lighting fixtures, backlights of automobile panels, automotive frontlights and signaling light sources, light sources in projection devices and the like.

However, the production of LEDs of the state of the art involves sophisticated techniques, especially for the application of color converter materials. In the sense of the present invention, the color converter material especially means and/or includes a material which is capable of absorbing light from the light emitting device and emitting light in a different wavelength, which will in most applications include green and/or red light.

It is an object of the present invention to provide a light emitting device which allows for most applications an easier build-up of the LED.

This object is solved by a light emitting device according to claim 1 of the present invention. Accordingly, a light emitting device is provided comprising at least one light source and at least one ceramic spherical color converter material with an average diameter from $\geq 25$ μm to $\leq 2500$ μm. As an example, the light source may be an inorganic LED, an organic LED or a laser diode.

A light emitting device and/or the use of such a at least one ceramic spherical color converter material for a light emitting device has shown for a wide range of applications within the present invention to have at least one of the following advantages:

Since the light emitting device comprises a spherical color converter material, this material can be easily caused, either by outside force and/or by self-assembly to assemble in densely packed structures under low pressures due to low intersphere friction.

Due to the macroscopic character (in comparison to atomic dimensions) of the spheres with a minimum average diameter 25 μm, the use of the of at least one ceramic spherical color converter material allows very accurate dosing of spheres, thereby reaching superior chromaticity control.

Due to the spherical shape of the at least one ceramic spherical color converter material within a wide range of applications excellent light conversion,—mixing, and—outcoupling properties can be achieved.

The at least one ceramic spherical color converter material as well as a light emitting device comprising such a at least one ceramic spherical color converter material can within a wide range of applications of the present invention be provided and/or manufactured using insophisticated and efficient techniques e.g. with the techniques described below.

Due to the precise deposition control of the spherical color converter material the combination of different color converter materials with modified luminescent properties can be easily realized.

The term "spherical" in the sense of the present invention especially means and/or includes that the average deviation of the shape of the at least one ceramic spherical color converter material from an ideal spherical shape is $\leq 10\%$, which is insofar a preferred embodiment of the present invention. Here the average deviation denotes the averaged difference between local diameter and average diameter of a ceramic spherical color converter material.

It is especially preferred that the average deviation of the shape of the at least one ceramic spherical color converter material from an ideal spherical shape is $\leq 5\%$, more preferred $\leq 2\%$ and most preferred $\leq 1\%$.

The term "ceramic material" in the sense of the present invention means and/or includes especially a crystalline or polycrystalline compact material or composite material with a controlled amount of pores or which is pore free.

The term "polycrystalline material" in the sense of the present invention means and/or includes especially a material with a volume density larger than 90 percent of the main constituent, consisting of more than 80 percent of single crystal domains, with each domain being larger than 0.5 μm in diameter and having different crystallographic orientations. The single crystal domains may be connected by amorphous or glassy material or by additional crystalline constituents.

According to a preferred embodiment of the present invention, a light emitting device is provided comprising at least a light source and at least one ceramic spherical color converter material with an average diameter from $\geq 100$ μm to $\leq 2000$ μm, more preferred $\geq 200$ μm to $\leq 1500$ μm, yet more preferred $\geq 250$ μm to $\leq 1000$ μm and most preferred $\geq 300$ μm to $\leq 750$ μm.

According to a preferred embodiment, the at least one ceramic spherical color converter material has a density of $\geq 95\%$ and $\leq 100\%$ of the theoretical density of the corresponding single crystal. This has been shown to be advantageous for a wide range of applications within the present invention since then the luminescent properties of the at least one ceramic spherical color converter material may be increased due to a decreased amount of scattered light. As a result of less scattering, the average light path within the ceramic spherical color converter material is decreased and therefore the amount of radiation less losses of light is reduced.

More preferably the at least one ceramic spherical color converter material has a density of $\geq 97\%$ and $\leq 100\%$ of the theoretical density of the corresponding single crystal, yet more preferred $\geq 98\%$ and $\leq 100\%$, even more preferred $\geq 98.5\%$ and $\leq 100\%$ and most preferred $\geq 99.0\%$ and $\leq 100\%$.

According to one embodiment of the present invention, the diameters of the spheres of the at least one ceramic spherical color converter material follow essentially a Log-normal distribution with a width s$\leq 0.1$. The Log-normal distribution denotes the distribution, where the number n(a) of ceramic spherical color converter materials with a diameter a and an average diameter $a_0$ is as follows:

$$n(a) = \frac{N}{as\sqrt{2\pi}} \exp\left[-\frac{\ln^2(a/a_0)}{2s^2}\right]$$

Here, s denotes the width of the distribution n(a). N is the total number of the ceramic spherical color converter materials. It has been shown within a wide range of applications of the present invention that especially the self-assembly of the at least one ceramic spherical color converter material is eased when the diameters are more uniform in size.

Preferably, the diameters of the spheres of the at least one ceramic spherical color converter material follow essentially a Log-normal distribution with a width s≦0.08, more preferred s≦0.06

According to a preferred embodiment of the present invention, the surface roughness (disruption of the planarity of a surface; measured as the root mean square of the difference between highest and deepest surface features) of the surface (s) of the at least one ceramic spherical color converter material is ≧0.001 µm and ≦1 µm.

According to an embodiment of the present invention, the surface roughness of the surface(s) of the at least one ceramic spherical color converter material is ≧0.005 µm and ≦0.8 µm, according to an embodiment of the present invention ≧0.01 µm and ≦0.5 µm, according to an embodiment of the present invention ≧0.02 µm and ≦0.2 µm. and according to an embodiment of the present invention ≧0.03 µm and ≦0.15 µm.

According to a preferred embodiment of the present invention, the specific surface area of the at least one ceramic spherical color converter material is ≧$10^{-7}$ m²/g and ≦0.1 m²/g. Here, specific surface area denotes the sum of all surface areas of all ceramic spherical color converting materials divided by the total mass of all ceramic spherical color converting materials.

According to a preferred embodiment of the present invention, the at least one ceramic spherical color converter material is essentially made out of a material selected out of the group comprising:

$(Lu_{1-x-y-a-b}Y_xGd_y)_3(Al_{1-z-c}Ga_zSi_c)_5O_{12-c}N_c:Ce_aPr_b$ wherein 0≦x≦1, 0≦y≦1, 0≦z≦0.1, 0<a≦0.2, 0<b≦0.1, and 0<c<1;

$(Sr_{1-x-y}Ba_xCa_y)_{2-z}Si_{5-a}Al_aN_{8-a}O_a:EU_z^{2+}$ wherein 0≦a≦5, 0<x≦1, 0≦y≦1, and 0<z≦0.1;

$(Sr_{1-a-b}Ca_bBa_c)Si_xN_yO_z:Eu_a^{2+}$ with 0.002≦a ≦0.2, 0.0≦b≦0.25, 0.0≦c ≦0.25, 1.5≦x≦2.5; 1.5≦y≦2.5, 1.5≦z≦2.5;

$(Sr_{1-u-v-x}Ca_vBa_x)_2(SiO_4):Eu_u$, with 0≦x≦1, 0≦u≦0.1, 0≦v≦1;

$(Ca_{1-x-y}Sr_x)S:Eu^{2+}_y$ with 0≦x≦1, 0≦y≦0.01;

$(Ca_{1-x-y-z}Sr_xBa_yMg_z)_{1-n}(Al_{1-a+b}B_a)Si_{1-b}N_{3-b}O_b:RE_n$, wherein 0≦x≦1, 0≦y ≦1, 0≦z≦1, 0≦a≦1, 0<b≦1 and 0.002≦n≦0.2 and RE is selected from Eu and/or Ce;

$M_x^{v+}Si_{12-(m+n)}Al_{m+n}O_nN_{16-n}$, with x=m/v and M being a metal, preferably selected out of the group comprising Li, Mg, Ca, Y, Sc, Ce, Pr, Nf, Sm, Eu, Gd, Tb, Dy, Ho, Er, Tm, Yb, Lu or mixtures thereof;

or mixtures thereof.

The term "essentially" means especially that ≧95%, preferably ≧97% and most preferred ≧99% of the at least one ceramic spherical color converter material consists out of this material. However, in some applications, trace amounts of additives may also be present in the bulk compositions. These additives particularly include such species known to the art as fluxes. Suitable fluxes include alkaline earth—or alkaline—metal oxides and fluorides, $SiO_2$ and the like and mixtures thereof.

According to a preferred embodiment of the present invention, the light emitting device comprises at least one further spherical material which consists out of a material which has no color converting properties.

By doing so, a mixture of spheres which are converting and non-converting can be set in order to adjust the color properties of the light emitting device quite easily within a wide range of applications of the present invention. It goes without saying that in this way the present invention also relates to a method of setting and/or adjusting the color properties of a light emitting device.

According to a preferred embodiment, the at least one further spherical material has an average diameter from ≧25 µm to ≦2500 µm, according to a preferred embodiment, the at least one further spherical material has an average diameter which deviates by <5% of the diameter of the at least one ceramic spherical color converter material.

According to a preferred embodiment, the at least one further spherical material is essentially made out of a material selected out of the group glass, ceramics, garnets (such as YAG), oxides, borates, phosphates, sulfides or mixtures thereof.

According to a preferred embodiment, the surface roughness of the at least one further spherical material is ≧0.005 µm and ≦0.8 µm, according to an embodiment of the present invention ≧20.01 µm and ≦0.5 µm, according to an embodiment of the present invention ≧0.02 µm and ≦0.2 µm. and according to an embodiment of the present invention ≧0.03 µm and ≦0.15 µm.

According to a preferred embodiment, the average deviation of the shape of the at least one further spherical material from an ideal spherical shape is ≦5%, more preferred ≦2% and most preferred ≦1%.

According to a preferred embodiment of the present invention, the at least one ceramic spherical color converter material is at least partly surrounded by a matrix material with an n (index of refraction) of ≧1.3. Preferably the at least one ceramic spherical color converter material is at least partly surrounded by a matrix material with an n (index of refraction) of ≧1.5, more preferred of ≧1.7 and most preferred ≧1.8.

According to a preferred embodiment of the present invention, the at least one ceramic spherical color converter material is at least partly surrounded by a matrix material with an n (index of refraction) of ≦$n_{cv}$–0.1 with $n_{cv}$ being the index of refraction of the at least one ceramic spherical color converter material. Preferably the at least one ceramic spherical color converter material is at least partly surrounded by a matrix material with an n (index of refraction) of ≦$n_{cv}$ with $n_{cv}$ being the index of refraction of the at least one ceramic spherical color converter material.

It has been shown that a matrix material with such refractive properties allows within a wide range of applications of the present invention to increase the luminescent properties of the light emitting device.

The matrix material is preferably selected out of the group comprising polymers, especially silicone polymers, glass, metal oxides, preferably aluminium, silicon and/or titanium oxide or mixtures thereof.

According to a preferred embodiment of the present invention, the matrix material is selected out of a mixture of a material of the group comprising polymers, especially silicone polymers, glass, or mixtures thereof and a luminescent material.

This allows for some applications within the present invention, where especially only a slight amount of a further luminescent material is needed to provide this material within the matrix, thereby increasing the compactness of the light emitting device.

According to a preferred embodiment of the present invention, the at least one ceramic spherical color converter material is provided in and/or with the light emitting device in a layer-like structure, preferably in an assembly which is essentially the closest packed arrangements of spheres or comes somewhat near to that assembly.

The term "essentially" means especially that ≧80%, preferably ≧85% and most preferred ≧90% of the at least one ceramic spherical color converter material are assembled in the closest packed arrangements of spheres. In case of the presence of non-luminescent spheres these are considered being part of the closest packed arrangement of spheres.

According to a preferred embodiment of the present invention, the light emitting device comprises at least two different ceramic spherical color converter materials. Preferably these at least two different ceramic spherical color converter materials are provided in layer-like structures, preferably in an assembly which is essentially the closest packed arrangement of spheres or comes somewhat near to that assembly.

It has been shown within a range of embodiments within the present invention, that by doing so, the correlated color temperature of the light emitting device may be set and/or adjusted quite easily.

The present invention furthermore relates to a method of producing and/or providing a ceramic spherical color converter material for a light emitting device according to the present invention comprising the steps of:

(a) pre-forming the material of the at least one ceramic spherical color converter material
(b) pressing the pre-formed material of the at least one ceramic spherical color converter material
(c) optionally a secondary treatment of the at least one ceramic spherical color converter material formed in step (b)

This allows within a wide range of applications to easily produce and/or provide a suitable ceramic spherical color converter material.

Preferably the step a) includes milling, pre-shaping and/or rough shaping the material of the at least one ceramic spherical color converter material.

Preferably the step b) includes isostatic pressing of the at least one ceramic spherical color converter material. preferably at a pressure of ≧1500 to ≦10000 bar, preferably of ≧2500 to ≦5500 bar.

Preferably the isostatic pressing of the at least one ceramic spherical color converter material is performed in a solvent, preferably water.

According to a preferred embodiment of the present invention, the material of the at least one ceramic spherical color converter material is covered with a coating layer before performing step b), which is optionally removed afterwards.

This has been shown to be advantageous within a wide range of applications within the present invention, since in practice this helps to achieve a spherical shape of the at least one ceramic spherical color converter material close to the ideal spherical shape.

The coating layer is preferably selected out of polymeric organic and/or inorganic materials, such as polyolefins.

Preferably, step c) includes grinding and/or polishing.

The present invention furthermore relates to a method of producing and/or providing a ceramic spherical color converter material for a light emitting device according to the present invention comprising a spray-drying step. It has been shown that this technique is applicable for some applications and/or materials within the present invention.

A light emitting device according to the present invention as well as a ceramic spherical color converter material as produced with the present method may be of use in a broad variety of systems and/or applications, amongst them one or more of the following:

Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The aforementioned components, as well as the claimed components and the components to be used in accordance with the invention in the described embodiments, are not subject to any special exceptions with respect to their size, shape, material selection and technical concept such that the selection criteria known in the pertinent field can be applied without limitations.

Additional details, features, characteristics and advantages of the object of the invention are disclosed in the subclaims, the figures and the following description of the respective figures and examples, which—in an exemplary fashion—show several embodiments and examples of a at least one ceramic spherical color converter material for use in a light emitting device according to the invention as well as several embodiments and examples of a light emitting device according to the invention.

Figure 1:
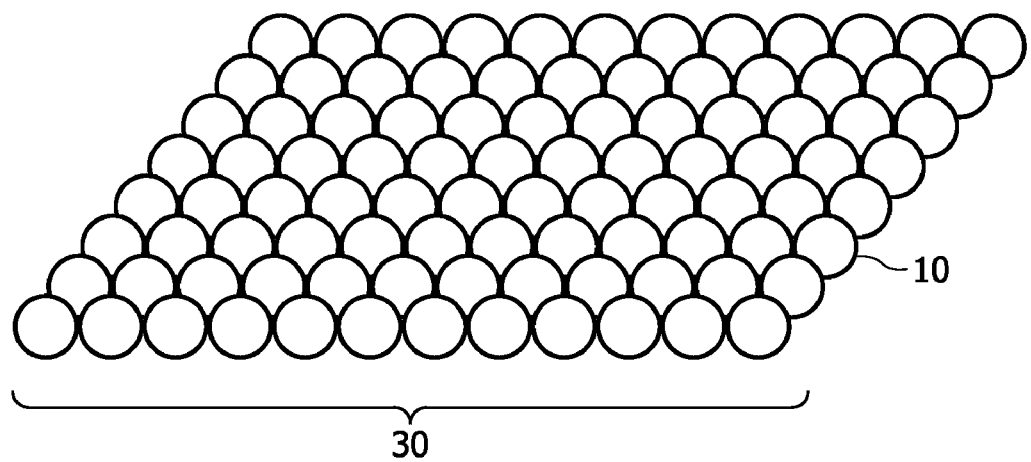
FIG. 1 shows a perspective schematic cut-out view first assembly of a ceramic spherical color converter material according to a first embodiment of the present invention.

FIG. 1 shows a perspective schematic cut-out view first assembly 30 of a ceramic spherical color converter material 10 according to a first embodiment of the present invention. It can be seen that the ceramic spherical color converter material 10 may in most applications be easily provided in form of a layer-like structure.

Figure 2:
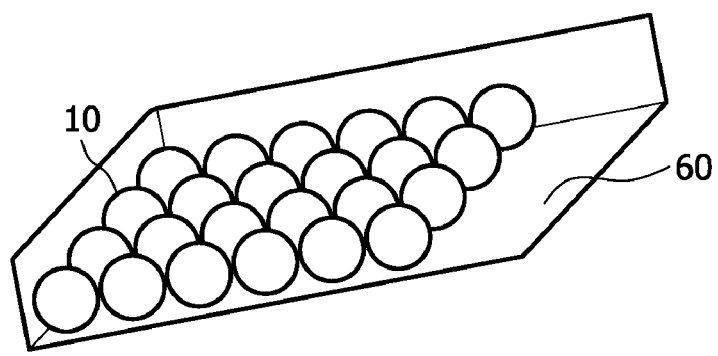
FIG. 2 shows a perspective schematic cut-out view of a setup for assembling a ceramic spherical color converter material according to a first embodiment of the present invention.

FIG. 2 shows a perspective schematic cut-out view of a setup for assembling a ceramic spherical color converter material according to a first embodiment of the present invention. This setup simply comprises a tilted plane 60, in case the angle between the tilted plane and the horizontal axis is set properly, the ceramic spherical color converter material 10 will easily form the desired assembly. It is an advantage of the present invention that for most steps, either of producing the ceramic spherical color converter material and/or the light emitting device employing such a ceramic spherical color converter material, the used techniques will be for a wide range of applications very easily set-up requiring no sophisticated equipment.

Figure 3:
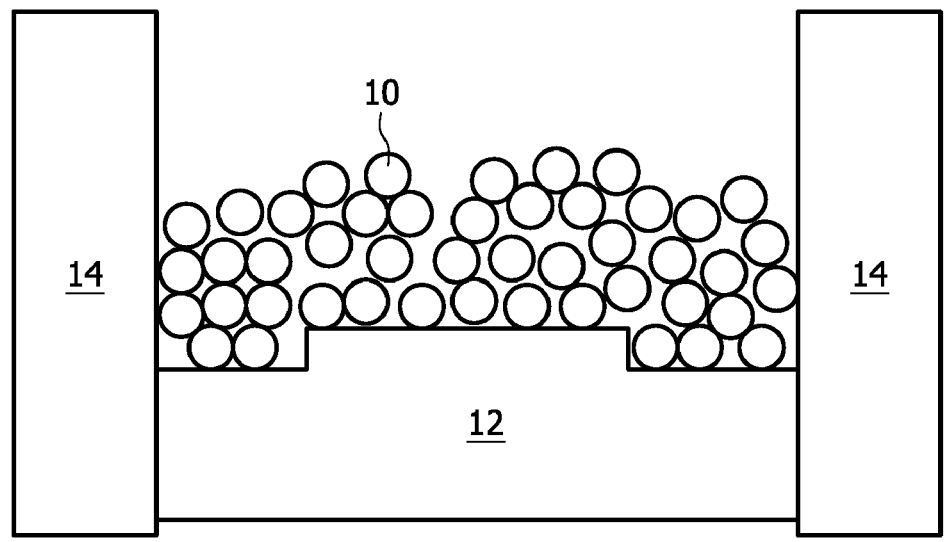
FIG. 3 shows a cross-sectional view of a forming device for producing a light emitting device according to a second embodiment of the present invention at a first stage of production.
Figure 4:
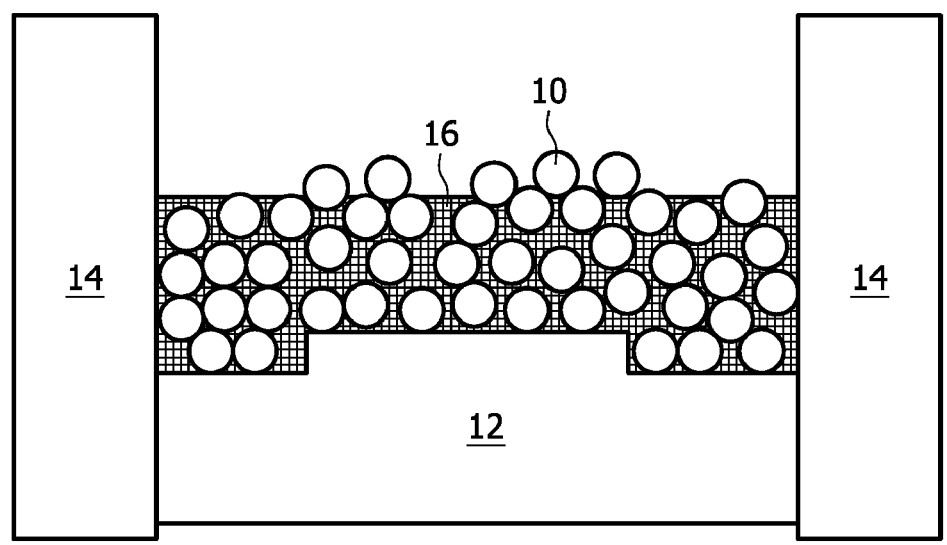
FIG. 4 shows a cross-sectional view of a forming device for producing a light emitting device according to a second embodiment of the present invention at a second stage of production.
Figure 5:
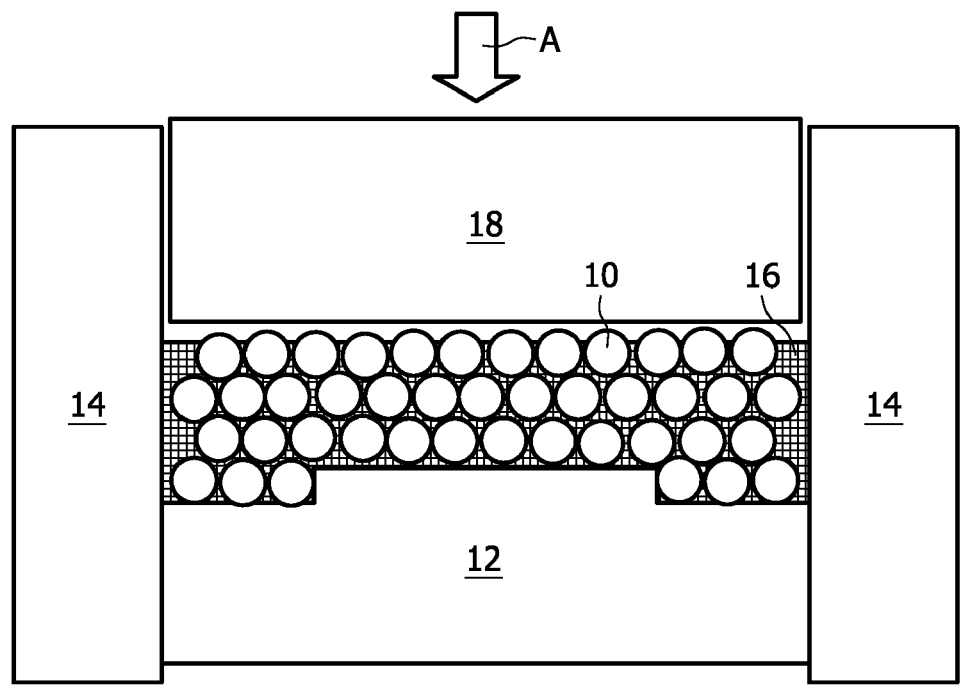
FIG. 5 shows a cross-sectional view of a forming device for producing a light emitting device according to a second embodiment of the present invention at a third stage of production.

FIG. 3 shows a cross-sectional view of a forming device for producing a light emitting device according to a second embodiment of the present invention at a first stage of production, FIGS. 4 and 5 show the second and third stage.

This forming device simply comprises several molds 12, 14 and 18. At first, the molds 12 and 14 are provided and the ceramic spherical color converter material 10 is simply filled into the molds. The amount of the ceramic spherical color converter material 10 is preferably set as to build several layers when the light emitting device is produced.

In a second step (as shown in FIG. 4) a matrix material 16 and/or matrix precursor material 16 is added. This matrix material will in the produced device fill out the space between the ceramic spherical color converter material 10 and is preferably of the material as described above.

Finally, as shown in FIG. 5, a further mold 18 is added to the present molds 12 and 14 and the ceramic spherical color converter material 10 and matrix (precursor) material is pressed in direction of the arrow A so that the ceramic spherical color converter material 10 will form a layered structure.

Either during the pressing or afterwards, the matrix precursor material 16 may be treated as to form either a polymeric and/or glass like structure. This may e.g. be achieved by melting the matrix precursor material 16 through applying heat.

Figure 6:
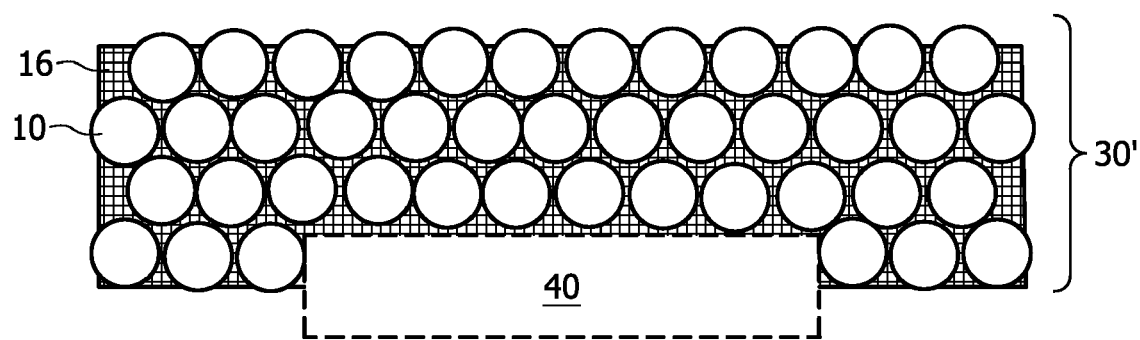
FIG. 6 shows an assembly of a ceramic spherical color converter material according to a second embodiment of the present invention embedded in a matrix material as produced with the forming device of FIG. 3 to 5.

FIG. 6 shows an assembly 30' of a ceramic spherical color converter material according to a second embodiment of the present invention embedded in a matrix material as produced with the forming device of FIG. 3 to 5. In a further step, a light source 40 (not shown but indicated in FIG. 6) is added. This light source may comprise any light source known to skilled persons in the art, e.g. an AlInGaN LED die.

If the sphere diameter of the ceramic spherical color converter material and the dimensions of the free mould space are properly chosen then a maximum sphere package density D of $$D = \pi/(3\sqrt{2}) = 0.7405$$

can be reached in the color converter arrangement 30'.

Figure 7:
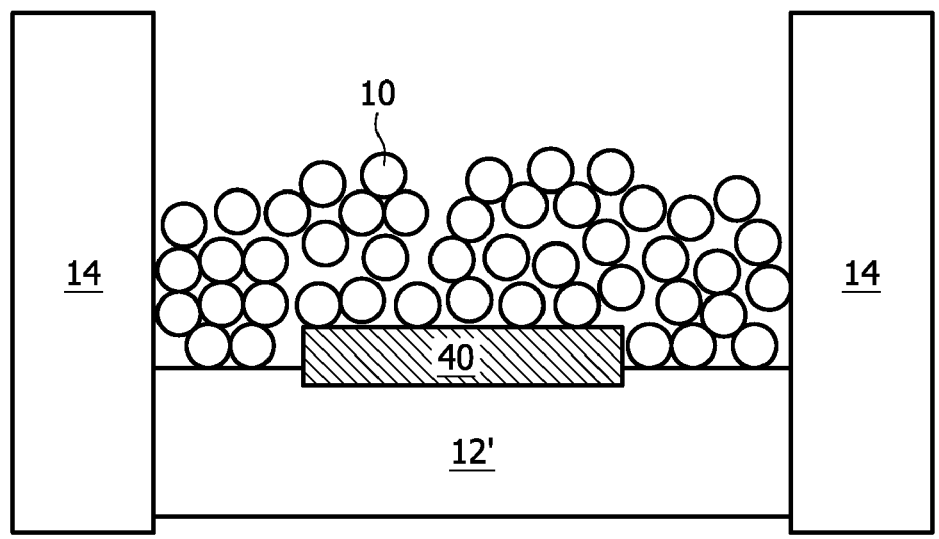
FIG. 7 shows a cross-sectional view of a forming device for producing a light emitting device according to a third embodiment of the present invention at a first stage of production.

FIG. 7 shows a cross-sectional view of a forming device for producing a light emitting device according to a third embodiment of the present invention at a first stage of production. The setup of this forming device is similar to that of FIGS. 3 to 5, except that the light source 40 is provided already at the beginning; for this reason the mold 12' is differently shaped.

Figure 8:
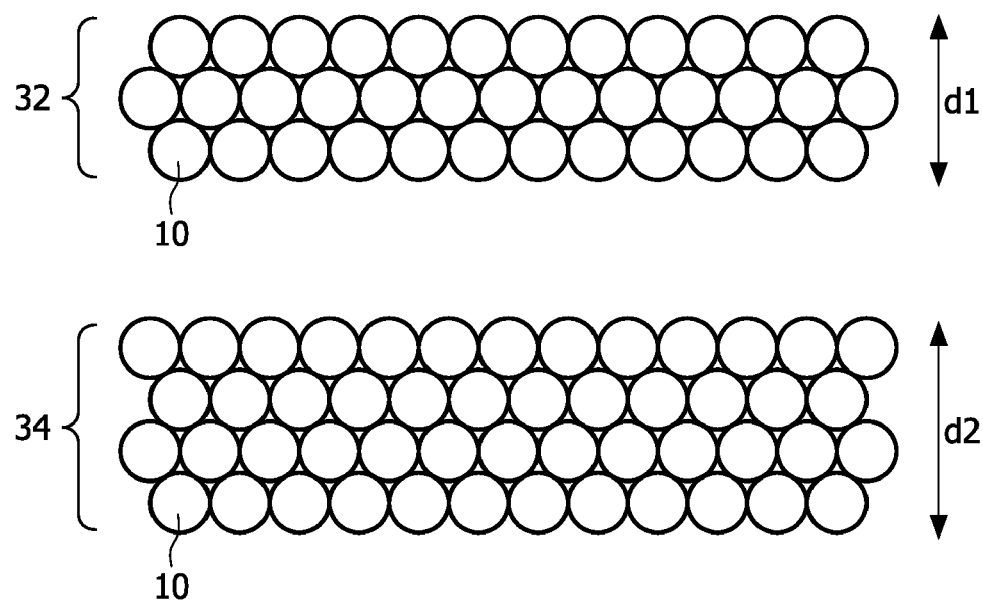
FIG. 8 shows two further assemblies of a ceramic spherical color converter material according to a third and fourth embodiment.

FIG. 8 shows two further assemblies 32, 34 of a ceramic spherical color converter material 10 according to a third and fourth embodiment of the present invention. It can be seen that, when properly formed, the ceramic spherical color converter material 10 will arrange itself in a layer-like structure 32, 34. The lengths d1 and d2 of the ceramic spherical color converter material 10 arrangements can easily be calculated.

It goes without saying that the lengths d1 and d2 will affect the amount of light, which is converted by the ceramic spherical color converter material. Since the arrangement and/or production of the light emitting device can be achieved very easily and the length of the ceramic spherical color converter material arrangement be calculated very reliable for a wide range of applications within the present invention, the ceramic spherical color converter material allows a reliable setting and/or adjustment of the color rendering properties and or correlated color temperature (CCT) of the light emitting device. By adding some further spheres of the ceramic spherical color converter material, the CCT may be shifted.

The amount of converted secondary light can be very accurately controlled by the thickness of the color converter assembly. This thickness may be described for closest packed arrangements of spheres as:

$$d_n = 2\sqrt{3} r \, n$$

with $d_n$: thickness of layered sphere assembly, r: sphere radius, n: number of hexagonally packed sphere layers. In practice this value was essentially reached with only a small deviation for many applications within the present invention.

Figure 9:
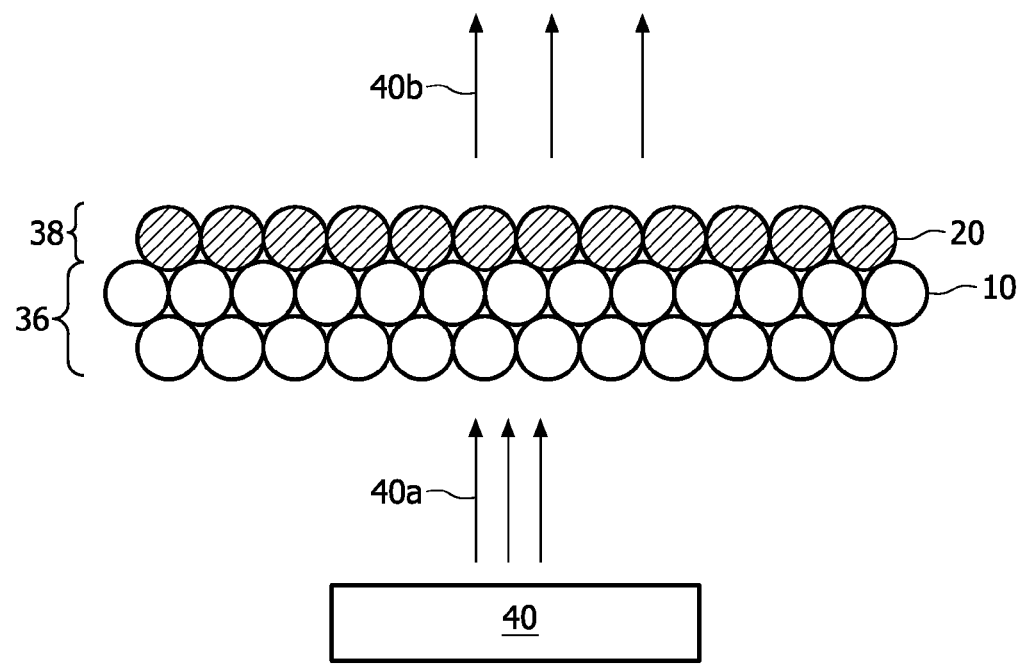
FIG. 9 shows a very schematic setup of a light emitting device according to a fifth embodiment of the present invention having two kinds of ceramic spherical color converter material.

FIG. 9 shows a very schematical setup of a light emitting device according to a fifth embodiment of the present invention having two kinds of ceramic spherical color converter material.

In this embodiment, two assemblies 36, 38 of two of ceramic spherical color converter materials 10 and 20 are present, which are provided in a layer-like structure on top of each other. The light emitting device comprises further a light source 40 (e.g. a AlInGaN LED die) emitting a primary light 40a, which is converted by the ceramic spherical color converter material to a secondary light 40b. The secondary light 40b may also comprise a certain amount of primary light 40a depending on the properties of the ceramic spherical color converter material. Since the two ceramic spherical color converter materials are of different material, the emitting properties will also differ, thereby allowing the change of the luminescent properties of the LED.

It goes without saying that a provision of a light emitting device according to FIG. 9 (or to further embodiments—not shown in the Figs.—where even more different ceramic spherical color converter materials are present) also allows a method of setting and/or adjustment of the color rendering properties and/or correlated color temperature (CCT) of the light emitting device.

According to a further embodiment (not shown in the FIGS.), however, a further color converter material is embedded in the matrix material 16 (as shown in FIG. 3). In the produced light emitting device, also two kinds of color converter materials will be present without having to use a further layer. This has shown to be advantageous for some applications within the present invention.

In a further embodiment (not shown in the FIGS, but similar to that of FIG. 9) two spherical materials are present, one of which is color-converting, the other is not. This also allows a method of setting and/or adjustment of the correlated color temperature (CCT) of the light emitting device. The non color-converting material serves in a sense as a "diluting" material for the color-converting material. By doing so, for many applications it can be easily achieved that light emitting devices with different CCTs (or other optical features) have the same size, since only the ratios of the color-converting and non-color converting spheres have to be changed.

Figure 10:
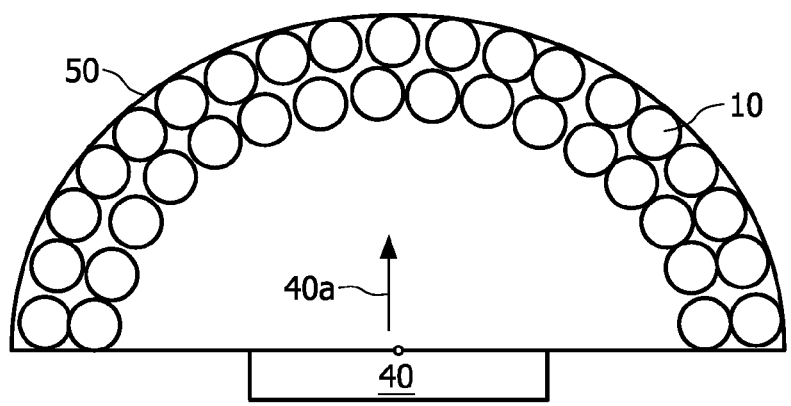
FIG. 10 shows a very schematic setup of a light emitting device according to a sixth embodiment of the present invention.

FIG. 10 shows a very schematic setup of a light-emitting device with a light source 40 according to a sixth embodiment of the present invention. In this embodiment, the ceramic spherical color converter material is set in a "glass dome" 50, which may be reflective. The light source 40 emits light towards the ceramic spherical color converter material. By doing so, the conversion of the ceramic spherical color converter material may be further increased.

The invention will be further understood by the following Example I which—in a merely illustrative fashion—shows the method of producing a ceramic spherical color converter material according to a further embodiment of the present invention.

EXAMPLE I $Al_2O_3$ (99.99%, mean grain size 350 nm), $Y_2O_3$ (99.99%, mean grain size 700 nm), and $CeO_2$ (>98.5%, mean grain size 40 nm) were milled with high purity alumina milling media (Nikkato, SSA-W 999) in isopropanol. After addition of polyvinylbutyral binder (Sekisui, BM-S), the powder suspension was dried and granulated to form a granulate with granule diameters in the 80-120 μm range. The granulate was then cold pressed into beads with an average diameter of 800 μm, and debindered at 500° C. in air The beads were then coated with a water impermeable coating layer of polyethylene. The polyethylene coating was applied by means of fluidized bed coating at temperatures in the range of 200-400° C., alternatively electrostatic spraying or flock spraying may be used.

The coated beads were then cold isostatically pressed at pressures ranging from 2000-4500 bar. After pressing residual organic binders and coatings were removed by firing the beads in air at 1000° C. (heating ramp: 50 K/h) for 12 hrs. The debindered ceramic green bodies were then sintered under a carbon monoxide atmosphere for 2 hrs at 1750° C.

After sintering and deagglomeration by mild grinding, the ceramic YAG:Ce spheres were hot isostatically pressed at 1700° C. and 500 bar argon (4.8). The transparent spheres were then ground and polished by wet milling on a roller bench with commercially available milling and polishing additives until the final surface finish and diameter was reached. After cleaning, the ceramic spheres were postannealed in air at 1350° C. for 4 hrs.

The thus achieved ceramic spherical color converter material had an average diameter of 450 μm diameter with an average deviation of the shape from an ideal spherical shape <1%.

The particular combinations of elements and features in the above detailed embodiments are exemplary only; the interchanging and substitution of these teachings with other teachings in this and the patents/applications incorporated by reference are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. A light emitting device comprising at least one light source and a plurality of ceramic spherical color converter materials, each spherical color converter material having a substantially uniform diameter, the uniform diameter being within a range of 100 μm to 2500 μm.

2. The light emitting device of claim 1, whereby the average deviation of the shape of the at least one ceramic spherical color converter material from an ideal spherical shape is $\leq 10\%$.

3. The light emitting device of claim 1, whereby the at least one ceramic spherical color converter material has a density of $\geq 95\%$ and $\leq 100\%$ of the theoretical density of the corresponding single crystal.

4. The light emitting device of claim 1 whereby the diameters of the spheres of the at least one ceramic spherical color converter material follow essentially a Log-normal distribution with a width $s \leq 0.1$.

5. The light emitting device of claim 1, whereby the at least one ceramic spherical color converter material has a surface roughness of $\geq 0.001$ μm and $\leq 1$ μm.

6. The light emitting device of claim 1 whereby the at least one ceramic spherical color converter material is essentially made out of a material selected out of the group comprising:

$(Lu_{1-x-y-a-b}Y_xGd_y)_3(Al_{l-z-c}Ga_zSi_c)_5O_{12-c}N_c:Ce_aPr_b$
wherein $0 \leq x \leq 1$, $0 \leq y \leq 1$, $0 \leq z \leq 0.1$, $0 < a \leq 0.2$, $0 < b \leq 0.1$, and $0 < c < 1$;

$(Sr_{1-x-y}Ba_xCa_y)_{2-z}Si_{5-a}Al_aN_{8-a}O_a:Eu_z^{2+}$ wherein $0 \leq a \leq 5$, $0 < x \leq 1$, $0 \leq y \leq 1$, and $0 < z \leq 0.1$;

$(Sr_{1-a-b}Ca_bBa_c)Si_xN_yO_z:Eu_a^{2+}$ with $0.002 \leq a \leq 0.2$, $0.0 \leq b \leq 0.25$, $0.0 \leq c \leq 0.25$, $1.5 \leq x \leq 2.5$; $1.5 \leq y \leq 2.5$, $1.5 \leq z \leq 2.5$;

$(Sr_{1-u-v-x}Ca_vBa_x)_2(SiO_4):Eu_u$ with $0 \leq x \leq 1$, $0 \leq u \leq 0.1$, $0 \leq v \leq 1$;

$(Ca_{1-x-y}Sr_x)S:Eu^{2+}_y$ with $0 \leq x \leq 1$, $0 \leq y \leq 0.01$;

$(Ca_{1-x-y-z}Sr_xBa_yMg_z)_{1-n}(Al_{l-a+b}B_a)Si_{1-b}N_{3-b}O_b:RE_n$,
wherein $0 \leq x \leq 1$, $0 \leq y \leq 1$, $0 \leq z \leq 1$, $0 \leq a \leq 1$, $0 < b \leq 1$ and $0.002 \leq n \leq 0.2$ and RE is selected from Eu and/or Ce;

$M_x^{v+}Si_{12-(m+n)}Al_{m+n}O_nN_{16-n}$, with $x=m/v$ and M being a metal, preferably selected out of the group comprising Li, Mg, Ca, Y, Sc, Ce, Pr, Nf, Sm, Eu, Gd, Tb, Dy, Ho, Er, Tm, Yb, Lu or mixtures thereof;

or mixtures thereof.

7. The light emitting device of claim 1 whereby the at least one ceramic spherical color converter material is at least partly surrounded by a matrix material with an n (index of refraction) of $\geq 1.3$.

8. A system comprising a light emitting device according to claim 1, the system being used in one or more of the following applications:
office lighting systems,
household application systems,
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems, medical lighting application systems,
indicator sign systems,
decorative lighting systems
portable systems
automotive applications, and
green house lighting systems.

9. The light emitting device of claim 1, wherein the plurality of ceramic spherical color converter materials is provided by a process that includes:
pre-forming the material of the at least one ceramic spherical color converter material, and
pressing the pre-formed material of the at least one ceramic spherical color converter material.

10. The light emitting device of claim 9, wherein the plurality of ceramic spherical color converter materials is provided by including a secondary treatment of the at least one pressed ceramic spherical color converter material.

11. The light emitting device of claim 1, wherein the plurality of ceramic spherical color converter materials is provided by a process that includes spray-drying the color converter material.

* * * * *